United States Patent
Iwai

(10) Patent No.: US 7,736,923 B2
(45) Date of Patent: Jun. 15, 2010

(54) OPTICAL SEMICONDUCTOR DEVICE AND METHOD FOR FABRICATING THE SAME

(75) Inventor: Takaki Iwai, Osaka (JP)

(73) Assignee: Panasonic Corporation, Osaka (JP)

( * ) Notice: Subject to any disclaimer, the term of this patent is extended or adjusted under 35 U.S.C. 154(b) by 22 days.

(21) Appl. No.: 12/078,831

(22) Filed: Apr. 7, 2008

(65) Prior Publication Data

US 2008/0194052 A1    Aug. 14, 2008

Related U.S. Application Data

(62) Division of application No. 11/009,054, filed on Dec. 13, 2004, now abandoned.

(30) Foreign Application Priority Data

Dec. 16, 2003    (JP) .............................. 2003-417792

(51) Int. Cl.
*H01L 21/00* (2006.01)

(52) U.S. Cl. .............................. 438/29; 438/22; 438/24; 438/39; 438/40; 438/41; 438/42; 438/43; 438/44; 438/45; 438/69; 257/E31.101; 257/E31.102; 257/443; 257/E31.109; 372/50; 372/50.1

(58) Field of Classification Search .................. 438/22, 438/24, 40–45, 69; 372/49.01, 50.1, 50.124, 372/50.21; 257/E33.001, E31.001, 95, 101, 257/102, 109

See application file for complete search history.

(56) References Cited

U.S. PATENT DOCUMENTS

| 5,479,426 | A | 12/1995 | Nakanishi et al. |
| 5,666,376 | A | 9/1997 | Cheng |
| 6,084,895 | A | 7/2000 | Kouchi et al. |
| 6,376,871 | B1* | 4/2002 | Arai .............................. 257/290 |
| 6,380,603 | B1 | 4/2002 | Takimoto et al. |
| 6,449,296 | B1 | 9/2002 | Hamasaki et al. |
| 6,459,711 | B1 | 10/2002 | Hamaguchi et al. |
| 6,534,794 | B1 | 3/2003 | Nakanishi et al. |
| 7,075,960 | B2 | 7/2006 | Kohara et al. |
| 2003/0143786 | A1* | 7/2003 | Thomas et al. .............. 438/151 |
| 2003/0148574 | A1 | 8/2003 | Thomas et al. |

FOREIGN PATENT DOCUMENTS

JP    51-139789    12/1976

(Continued)

OTHER PUBLICATIONS

Japanese office action issued in corresponding Japanese Patent Application No. 2004-325155, dated Mar. 20, 2007.

*Primary Examiner*—Charles D Garber
*Assistant Examiner*—Yasser A Abdelaziez
(74) *Attorney, Agent, or Firm*—McDermott Will & Emery LLP

(57) ABSTRACT

An optical semiconductor device includes: a first conductivity type first semiconductor region; a first conductivity type second semiconductor region formed on the first semiconductor region; a second conductivity type third semiconductor region formed on the second semiconductor region; a photodetector section formed of the second semiconductor region and the third semiconductor region; a micro mirror formed of a trench formed selectively in a region of the first semiconductor region and the second semiconductor region except the photodetector section; and a semiconductor laser element held on the bottom face of the trench. A first conductivity type buried layer of which impurity concentration is higher than those of the first semiconductor region and the second semiconductor region is selectively formed between the first semiconductor region and the second semiconductor region in the photodetector section.

3 Claims, 11 Drawing Sheets

FOREIGN PATENT DOCUMENTS

| | | |
|---|---|---|
| JP | 9-219534 | 8/1997 |
| JP | 2001-15849 | 1/2001 |
| JP | 2001-102676 A | 4/2001 |
| JP | 2001-111165 | 4/2001 |
| JP | 2001-144317 | 5/2001 |
| JP | 2001-345508 | * 12/2001 |
| JP | 2003-158291 | 5/2003 |
| JP | 2004-349432 | 12/2004 |

* cited by examiner

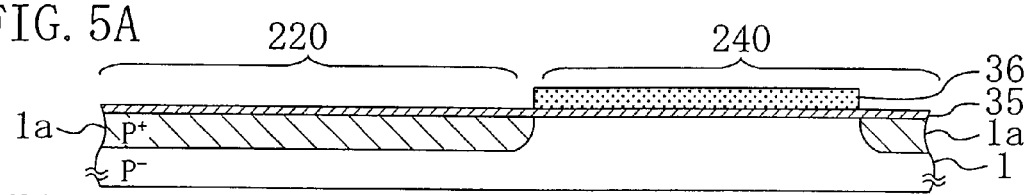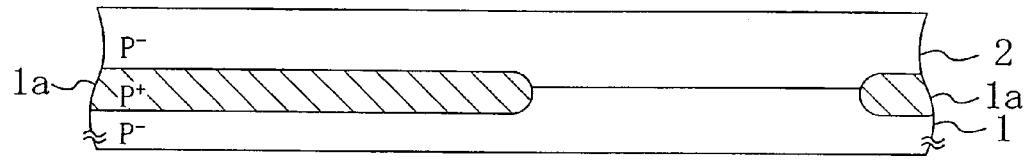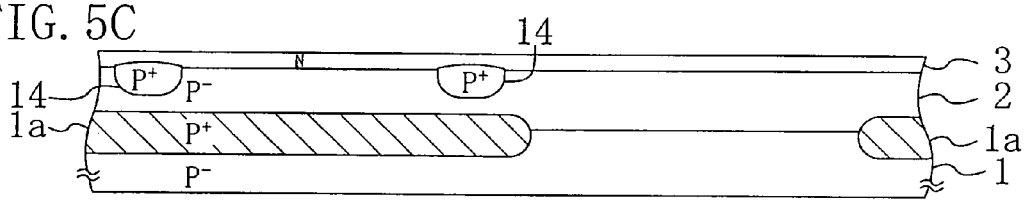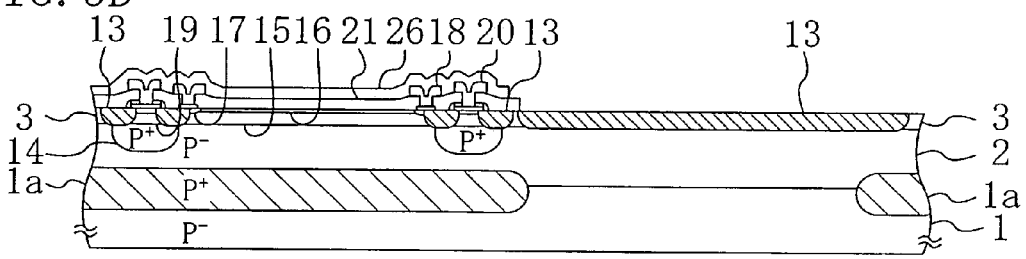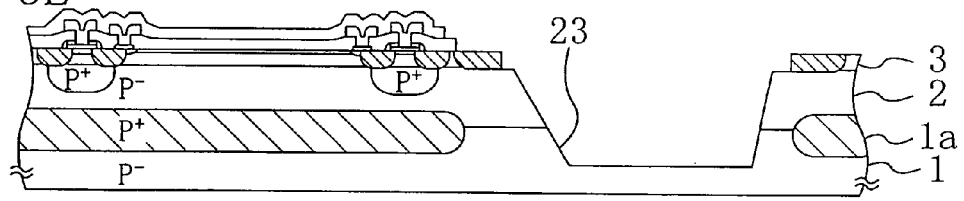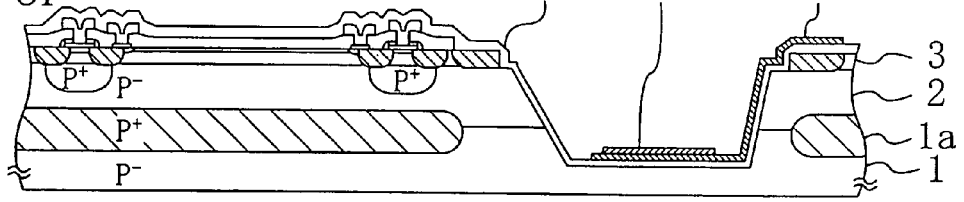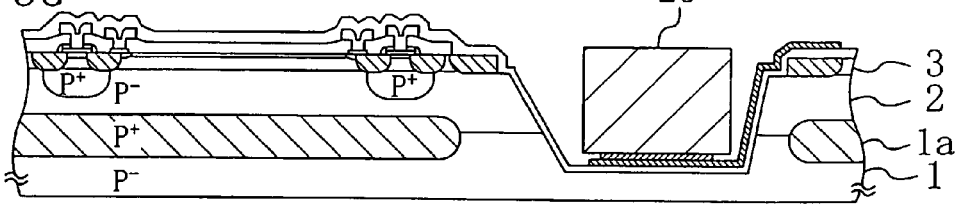

OPTICAL SEMICONDUCTOR DEVICE AND METHOD FOR FABRICATING THE SAME

CROSS REFERENCE TO RELATED APPLICATIONS

This application is a Divisional of U.S. application Ser. No. 11/009,054, filed Dec. 13, 2004 now abandoned, and claims priority under 35 U.S.C. §119(a) on Patent Application No. 2003-417792 filed in Japan on Dec. 16, 2003, the entire contents of each of which are hereby incorporated by reference.

BACKGROUND ART

The present invention relates to an optical semiconductor device in which a photodetector and a semiconductor laser element are formed on a single substrate and a method for fabricating the same.

A light emitting element and a photodetector are elements for mutual conversion between an optical signal and an electric signal, and are employed in various kinds of art field. In the field of optical disks such as CDs (Compact Discs) and DVDs (Digital Versatile Disc), they are main devices in optical pickups for reading/writing signals recorded on an optical disks.

In recent years, in accordance with demand for high performance and high integration, a photodiode serving as a photodetector and various electronic elements such as a bipolar transistor, a resister, a capacitance, are formed on a single substrate to compose a so-called opto-electronic integrated circuit (OEIC) device. For further size reduction and higher integration, OEIC devices are widely used in which a semiconductor laser element as a light emitting element and a micro mirror for changing a light path of the laser beam output form the semiconductor laser element are mounted. The OEIC devices of this kind are generally formed by a bipolar transistor fabricating method. In addition, the OEIC devices are required to include both a photodetector having high photosensitivity, high-speed operability and low noise characteristics and a high-speed, highly accurate bipolar transistor.

A conventional optical semiconductor device will be described below with reference to the drawings.

FIG. 10 shows schematically a sectional construction of an optical semiconductor device, that is, an OEIC device according to the conventional example. As shown in FIG. 10, a N-type epitaxial layer 102 is formed on a principal surface of a semiconductor substrate 101 made of P-type low impurity concentration silicon.

In the semiconductor substrate 101 and the N-type epitaxial layer 102, a transistor section 200 composed of a NPN bipolar transistor, a photodetector section 220 composed of a PIN photodiode and a light emitting element section 240 including a semiconductor laser chip 125 are formed to compose the OEIC device.

The transistor section 200, which is a two-layer polysilicon self aligned type NPN transistor, is composed of: a high concentration N-type emitter region 106; a P-type base region 107 formed below the emitter region 106; a collector region 108 made of the N-type epitaxial layer 102 and formed below the base region 7; a high concentration N-type collector buried region 109 formed below the collector region 108; an emitter electrode 110 formed above the emitter region 106; a base electrode 111 connected electrically to the peripheral portion of the base region 107; and a collector electrode 112 formed above the collector buried region 109 and connected electrically to the end portion of the collector buried region 109.

The light receiving section 220 is composed of: a cathode layer 115 made of the N-type epitaxial layer 102; a high concentration N-type cathode surface layer 116 formed on the cathode layer 115; a high concentration N-type cathode contact layer 117 formed around the cathode surface layer 116; and a cathode electrode 118 formed above the cathode contact layer 117.

In each of the transistor section 200 and the photodetector section 220, an isolation oxide film 113 for electrically isolating the elements is formed by local thermal oxidation, that is, so-called LOCOS. A high concentration P$^+$-type isolation layer 114 is formed below the isolation oxide film 113.

In the photodetector section 220, the P$^+$-type isolation layer 114 located in the peripheral portion of the photodetector section 220 in the semiconductor substrate 101 functions as a part of an anode and is connected electrically to an anode electrode 120 with the intervention of a high concentration P-type anode contact layer 119 formed on the P$^+$-type isolation layer 114. A portion of the low concentration P-type semiconductor substrate 101 located below the cathode layer 115 serves as an anode region, and is taken outside as a current from the anode electrode 120 through the P$^+$-type isolation layer 114 and the anode contact layer 119. On the cathode surface layer 116 serving as a light receiving face, an anti-reflection film 121 is provided for reducing reflection of incident light 122 on the cathode surface layer 116.

In the light emitting element section 240, a micro mirror region 123 is formed which is formed of a trench formed by digging the N-type epitaxial layer 102 and the upper part of the semiconductor substrate 101 by anisotropic etching. On the bottom face of the trench, a semiconductor laser chip 125 is fixed with the intervention of a laser lower electrode 128, a laser wire 127 and a protection film 126. The laser wire 127 is lead outside the trench along the wall face from the bottom face of the trench. The protection film 126 is formed so as to cover each upper face of the transistor section 200 and the photodetector section 220.

As shown in FIG. 10, laser light emitted from a side facet of the semiconductor laser chip 125 is reflected on the surface of the micro mirror region 123 to be output in a direction approximately perpendicular to the principal surface of the semiconductor substrate 110.

The operation of the thus composed OEIC device will be described below.

Application of a current over a threshold value to the semiconductor laser chip 125 causes induced emission and oscillation, so that coherent laser light 129 is output in a direction parallel to the principal surface of the semiconductor substrate 101. In the case where the micro mirror region 123 forms an angle at 45 degrees with respect to the substrate surface, the emitted laser light 129 is reflected on the surface of the micro mirror region 123 to rise in a direction perpendicular to the substrate surface. The reflected laser light 129 is irradiated on, for example, an optical disk or the like and a part of the thus reflected light becomes incident light 122 to enter in the photodetector section 220.

The incident light 122 that enters in the photodetector section 220 is absorbed in the semiconductor substrate 101 serving as the anode and the cathode layer 115 to generate electron hole pairs. When reverse bias voltage is applied to the photodetector section 220 at that time, a depletion layer is extended toward the semiconductor substrate 101 where impurity concentration is low. The electron hole pairs generated in the extended depletion layer and the vicinity thereof diffuse and drift separately so that the electrons and the holes reach the cathode contact layer 117 and the anode contact layer 119, respectively, thereby generating a photocurrent. Upon receiving the thus generated photocurrent, an electronic circuit composed of a NPN transistor, a resistor, a capacitor and the like performs predetermined amplification and signal processing to output the photocurrent as a recording or replay signal of an optical disk.

As described above, in recent years, in optical semiconductor devices having photodetector for optical pickup used in CDs and DVDs, high photosensitivity, high-speed operability and downsizing are strongly demanded in association with high-speed driving of optical disks and increasing density of recorded signals.

In the aforementioned conventional optical semiconductor device, however, the photocurrent generated from incident light is divided to the diffusion current component and the drift current component as described above, wherein the diffusion current component is dominant diffusion that the minority carriers move up to the end portion of the depletion layer. For this reason, the response speed of the diffusion current component is lower than the drift current component drifting by the electric field in the depletion layer, which is a factor of deterioration the frequency characteristic of the photodetector section 220 made of a photodiode.

Especially, infrared light used in CDs, which has a small absorption coefficient to silicon, reaches deep inside of the semiconductor substrate 101 and carriers generated at the deep part contributes to the current, which restrict high-speed operation. In this connection, it is impossible to form the photodetector section 220 and the light emitting element section 240 integrally on a single semiconductor substrate 101 for exhibiting high photosensitivity and high-speed operation.

SUMMARY OF THE INVENTION

The present invention has its object of forming on a single substrate a photodetector section having high photosensitivity and high-speed operability and a light emitting element section in which a semiconductor laser chip is mounted by solving the above conventional problems.

The present inventor fabricated an optical semiconductor device having the construction shown in FIG. 11 for achieving the above object. The optical semiconductor device having this construction will be described below as a reference example.

FIG. 11 shows a schematic sectional construction of the optical semiconductor device according the reference example of the present invention. In FIG. 11, the same reference numerals are assigned to the same members as those shown in FIG. 10 and the description thereof is omitted.

As shown in FIG. 11, in the optical semiconductor device according to the reference example, a P-type anode buried layer 101a of which impurity concentration is three-or-more-digit larger, namely $10^3$ times larger than that of a semiconductor substrate 101 is formed entirely in a region under a P$^+$-type isolation layer 114 in the semiconductor substrate 101 made of low impurity concentration P-type silicon. A P$^-$-type epitaxial layer 103 of which impurity concentration is approximately the same as that of the semiconductor substrate 101 is formed on the anode buried layer 101a.

Accordingly, a transistor section 200 and a photodetector section 220 are formed of the P$^-$-type epitaxial layer 103 and the N-type epitaxial layer 102 grown thereon, and a trench of a light emitting element section 240 is formed through the N-type epitaxial layer 102, the P$^-$-type epitaxial layer 103 and the anode buried layer 101a.

As described above, when the difference in impurity concentration between the semiconductor substrate 101 and the anode buried layer 101a is set to be three digits or more, the carriers generated by light absorbed in the semiconductor substrate 100 are inhibited from diffusion by a potential barrier caused due to concentration gradient and are re-coupled, with a result of no contribution to the current (photocurrent). If the thickness of the P$^-$-type epitaxial layer 103 is set so that the end part of the depletion layer reaches the anode buried layer 101a, the drift current is dominant in the photocurrent, resulting in high-speed operation.

Further, though the generated holes moves from the P$^-$-type epitaxial layer 103 to the anode buried layer 101a and to the anode contact layer 119 through the P$^+$-type isolation layer 114, the provision of the anode buried layer 101a, which is a high concentration layer, enables high-speed response with smaller series resistance than that in the case with no anode buried layer 101a provided.

The N-type epitaxial layer 102, which serves as the collector region 108 of the NPN bipolar transistor composing the transistor section 200, must not have low concentration, and accordingly, the cathode layer 115 must not be depleted. For this reason, the concentration of the cathode surface layer 116 is set higher than that of the cathode layer 115 so as to enhance the photosensitivity and the frequency characteristic to light of short wavelength almost of which is absorbed in the vicinity of the surface of the N-type epitaxial layer 102 for attain high efficiency of photoelectric conversion by utilizing the concentration gradient. Concentration difference necessary for attain the high efficiency of the photoelectric conversion is se to be three or more digits.

With the above construction, the optical semiconductor device according to the reference example of the present invention sufficiently ensures an effective region of the depletion layer by utilizing the impurity concentration difference between the low impurity concentration portion (P$^-$-type epitaxial layer 103) contributing to the photosensitivity of the photodetector section 220 and the surface (cathode surface layer 116) of the photodetector section 220. As a result, the frequency characteristic and the photosensitivity even to light having a short optical absorption length can be enhanced and the capacitance can be reduced without deterioration of the operation characteristic of the transistor section 200.

In the optical semiconductor device according to the reference example, the light path is changed in the direction perpendicular to the substrate surface by reflecting the emitted light 129 on the micro mirror region 123 provided as the trench in the light emitting element section 240. Therefore, the surface of the micro mirror region 123 is demanded to be flat with high precision.

Anisotropic wet etching is used for forming the trench to be the micro mirror region 123 in general. Potassium hydroxide (KOH), for example, is used for an etching solution for the anisotropic wet etching. However, due to a large difference in impurity concentration between the P$^+$-type anode buried layer 101a and the P$^-$-type epitaxial layer 103, the etch rate becomes different between the anode buried layer 101a and the P$^-$-type epitaxial layer 103. The difference in etch rate causes a line and further causes a pit, which is developed from an impurity in the anode buried layer 101a due to crystal defect, in the micro mirror region 123 formed of the wall face of the trench. The emitted light 129 may be scattered at the line or the pit and the rising angle of the reflected light may vary.

Taking account of the above problems, the present inventor has conducted various researches on the reference example to find that in order to form on a single substrate a transistor section capable of high-speed operation, a photodetector section having high photosensitivity and high-speed operability and a light emitting element section in which a semiconductor laser chip is mounted, in an optical semiconductor device, the photodetector section 220 in which the anode buried layer 101*a* is provided is formed selectively only under the photodetector section 220 so that the anode buried layer 101*a* is not exposed at the micro mirror region 123 formed of the wall face of the trench of the light emitting element section 240.

Specifically, an optical semiconductor device according to the present invention includes: a first conductivity type first semiconductor region; a first conductivity type second semiconductor region formed on the first semiconductor region; a second conductivity type third semiconductor region formed on the second semiconductor region; a photodetector section formed of the second semiconductor region and the third semiconductor region; a micro mirror formed of a trench formed selectively in a region of the first semiconductor region and the second semiconductor region except the photodetector section; and a semiconductor laser element held on a bottom face of the trench, wherein a first conductivity buried layer of which impurity concentration is higher than those of the first semiconductor region and the second semiconductor region is formed between the first semiconductor region and the second semiconductor region in the photodetector section.

In the optical semiconductor device according to the present invention, an effective region of the depletion layer is ensured sufficiently by utilizing the difference in impurity concentration between the second semiconductor region that contributes to the photosensitivity of the photodetector section and the third semiconductor region, with a result that the frequency characteristic and the photosensitivity for light having short optical absorption wave are enhanced and the capacitance is reduced. Further, with no buried layer exposed at the micro mirror formed of the trench, a line and a pit caused by crystal defect, which are generated due to difference in etch rate generated by difference in impurity concentration between the buried layer and the second semiconductor region are prevented, with a result that the micro mirror excellent in flatness can be obtained. Hence, a photodetector having high-speed operability and high photosensitivity and a semiconductor laser element can be formed on a single substrate without deterioration of the optical characteristics.

In the optical semiconductor device of the present invention, it is preferable to form the second semiconductor region by epitaxial growth.

In the optical semiconductor device of the present invention, it is preferable to form the third semiconductor region by epitaxial growth.

The optical semiconductor device of the present invention preferably includes a transistor formed in a region of the second semiconductor region and the third semiconductor region except the photodetector section and the trench.

A first optical semiconductor device fabrication method according to the present invention includes the steps of: forming selectively a first conductivity type buried layer of which impurity concentration is higher than that of a first conductivity type first semiconductor region by ion implantation to a photodetector section formation portion of the first semiconductor region; forming by epitaxial growth a first conductivity type second semiconductor region of which impurity concentration is lower than that of the buried layer on the first semiconductor region in which the buried layer is formed; forming a second conductivity type third semiconductor region in the upper part of the second semiconductor region; forming a photodetector section made of the second semiconductor region and the third semiconductor region in the photodetector section formation portion of the second semiconductor region and the third semiconductor region; forming, by forming a trench by performing selective anisotropic etching on a region of the first semiconductor region and the second semiconductor region except the photodetector section, a micro mirror formed of a wall face of the trench; and bonding a semiconductor laser element, which is prepared beforehand in a form of a chip, onto a bottom face of the thus formed trench.

In the first optical semiconductor device fabrication method, the first conductivity type second semiconductor region of which impurity concentration is lower than that of the buried layer is formed on the first semiconductor region in which the buried layer is formed in the photodetector section formation portion selectively, and the second conductivity type third semiconductor region is formed on the second semiconductor region. Then, the trench is formed by selective anisotropic etching to the region except the photodetector section. Accordingly, the buried layer of which impurity concentration is higher than that of the first semiconductor region is not exposed at the wall face of the trench forming the micro mirror. Hence, the optical semiconductor device according to the present invention can be realized.

A second optical semiconductor device fabrication method according to the present invention includes the steps of: forming selectively a first conductivity type buried layer of which impurity concentration is higher than that of a first conductivity type first semiconductor region by ion implantation to a photodetector section formation portion of the first semiconductor region; forming by epitaxial growth a first conductivity type second semiconductor region of which impurity concentration is lower than that of the buried layer on the first semiconductor region in which the buried layer is formed; forming a second conductivity type third semiconductor region on the second semiconductor region by epitaxial growth; forming a photodetector section made of the second semiconductor region and the third semiconductor region in the photodetector section formation portion of the second semiconductor region and the third semiconductor region; forming, by forming a trench by performing selective anisotropic etching on a region of the first semiconductor region and the second semiconductor region except the photodetector section, a micro mirror formed of a wall face of the trench; and bonding a semiconductor laser element, which is prepared beforehand in a form of a chip, onto a bottom face of the thus formed trench.

In this way, in the second optical semiconductor device fabrication method, the second conductivity type third semiconductor region in the first fabrication method is epitaxial grown.

A third optical semiconductor device fabrication method according to the present invention includes the steps of: forming a first conductivity type second semiconductor region on a first conductivity type first semiconductor region by epitaxial growth; forming selectively a first conductivity type buried layer of which impurity concentration is higher than that of the first semiconductor region by ion implantation to a boundary portion between the first semiconductor region and the second semiconductor region and a photodetector section formation portion in the vicinity of the boundary portion; forming a second conductivity type third semiconductor region in an upper part of the second semiconductor region; forming a photodetector section made of the second semiconductor region and the third semiconductor region in a photodetector section formation portion of the second semiconductor region and the third semiconductor region; forming, by forming a trench by performing selective anisotropic etching on a region of the first semiconductor region and the second semiconductor region except the photodetector section, a micro mirror formed of a wall face of the trench; and bonding a semiconductor laser element, which is prepared beforehand in a form of a chip, onto a bottom face of the thus formed trench.

In this way, in the third optical semiconductor device fabrication method, the second semiconductor region is epitaxially grown on the first semiconductor region, and then, the first conductivity type buried layer of which impurity concentration is higher than that of the first semiconductor region is formed selectively in the boundary portion between the first semiconductor region and the thus formed second semiconductor region and the photodetector section formation portion in the vicinity of the boundary portion.

A fourth optical semiconductor device fabrication method according to the present invention includes the steps of: forming a first conductivity type second semiconductor region on a first conductivity type first semiconductor region by epitaxial growth; forming selectively a first conductivity type buried layer of which impurity concentration is higher than that of the first semiconductor region by ion implantation to a boundary portion between the first semiconductor region and the second semiconductor region and a photodetector section formation portion in the vicinity of the boundary portion; forming a second conductivity type third semiconductor region on the second semiconductor region by epitaxial growth; forming a photodetector section made of the second semiconductor region and the third semiconductor region in a photodetector section formation portion of the second semiconductor region and the third semiconductor region; forming, by forming a trench by performing selective anisotropic etching on a region of the first semiconductor region and the second semiconductor region except the photodetector section, a micro mirror formed of a wall face of the trench; and bonding a semiconductor laser element, which is prepared beforehand in a form of a chip, onto a bottom face of the thus formed trench.

In this way, in the fourth optical semiconductor device fabrication method, the second conductivity type third semiconductor region in the third fabrication method is epitaxially grown.

It is preferable that the first to fourth optical semiconductor device fabrication methods further includes the step of: forming selectively a transistor in a region of the second semiconductor region and the third semiconductor region except the photodetector section and the trench.

BRIEF DESCRIPTION OF THE DRAWINGS

FIG. 5A through to FIG. 5G are sections showing the step sequence of a first fabrication method of the optical semiconductor device according to the second embodiment of the present invention.

DETAILED DESCRIPTION OF THE PRESENT INVENTION

First Embodiment

The first embodiment of the present invention will be described below with reference to the drawings.

Figure 1:
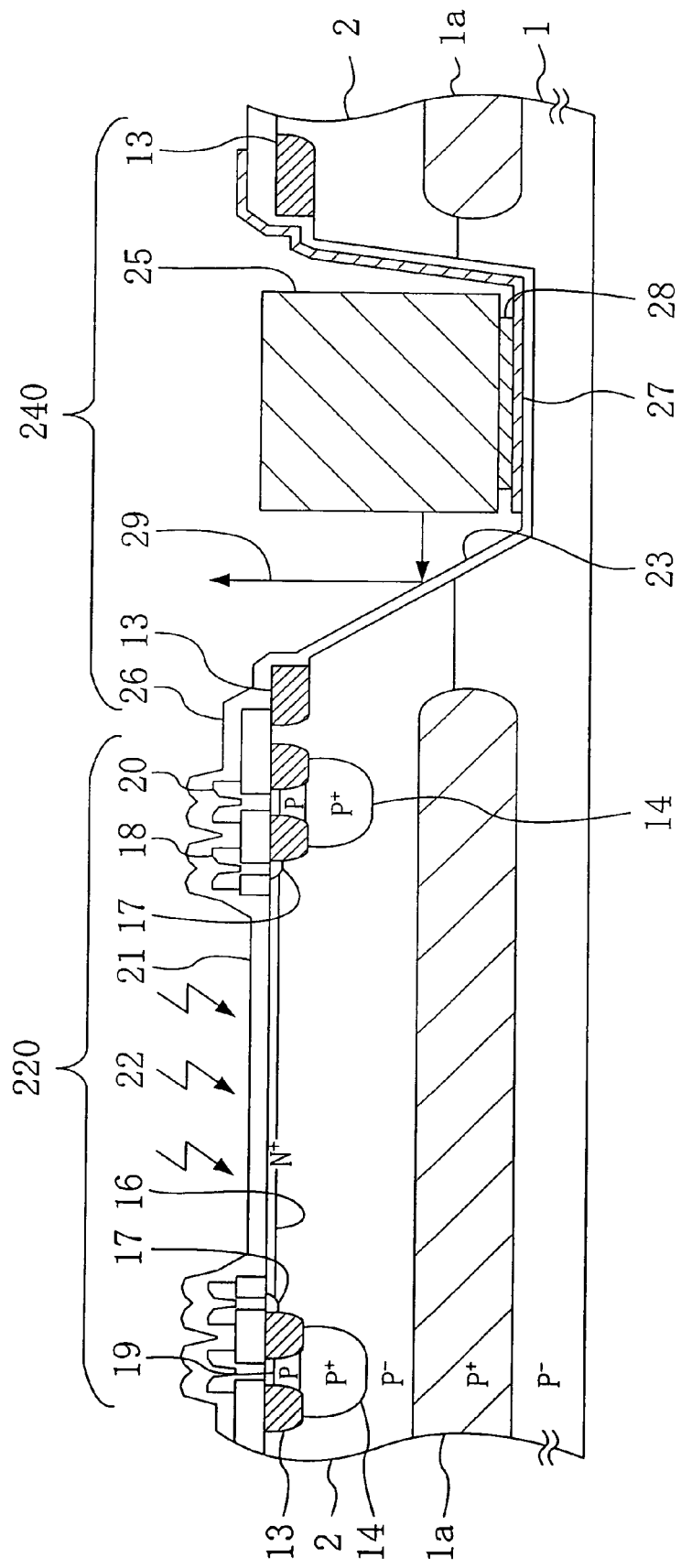
FIG. 1 shows a schematic construction in section of an optical semiconductor device according to the first embodiment of the present invention.

FIG. 1 shows a schematic construction in section of an optical semiconductor device (OEIC device) according to the first embodiment of the present invention. As shown in FIG. 1, a low concentration $P^-$-epitaxial layer 2 having, for example, a thickness of about 10 µm and an impurity concentration of about $1 \times 10^{14}$ cm$^{-3}$ is formed on the principal surface of a semiconductor substrate 1 made of P-type low impurity concentration silicon (Si).

In the semiconductor substrate 1 and the $P^-$-type epitaxial layer 2, a photodetector section 220 made of a PIN photodiode and a light emitting element section 240 including a semiconductor laser chip 25 are formed to compose the OEIC device.

The photodetector section 220 includes: a N-type cathode surface layer 16 having a thickness of, for example, 0.1 µm and formed in the upper part of the $P^-$-type epitaxial layer 2; a high concentration $P^+$-type anode buried layer 1a between the semiconductor substrate 1 and the $P^-$-type epitaxial layer 2 and having, for example, a thickness of about 4 µm and an impurity concentration of at least $1 \times 10^{17}$ cm$^{-3}$; a cathode contact layer 17 formed in the peripheral portion of the cathode surface layer 16; and a cathode electrode 18 formed on the cathode contact layer 17. The photodetector section 220 further includes: double isolation oxide films 13 formed in the peripheral portion of the cathode contact layer 17 with a space left from each other by LOCOS or the like; an anode contact layer 19 formed between adjacent isolation oxide films 13; a high concentration $P^+$-type isolation layer 14 formed under the anode contact layer 19 in the $P^-$-type epitaxial layer 2 and functioning as a part of an anode; and an anode electrode 20 formed on the anode contact layer 19.

In the light emitting element section 240, a micro mirror region 23 is provided which is formed of a trench formed by digging the P⁻-type epitaxial layer 2 and the upper part of the semiconductor substrate 1 by anisotropic etching. A semiconductor laser chip 25 is fixed at the bottom of the trench, with a laser lower electrode 28, a laser wire 27 and a protection film 26 intervened. The laser 27 wire is lead outside the trench along the bottom face and the wall face of the trench. The protection film 26, which is made of silicon oxide or silicon nitride, is formed so as to cover also the upper face of the photodetector section 220.

The operation of the thus constructed optical semiconductor device will be described below.

Application of a current over a threshold value to the semiconductor laser chip 25 causes induced emission and oscillation, so that coherent laser light 29 is output in a direction parallel to the principal surface of the semiconductor substrate 1. In the case where the micro mirror region 23 forms an angle at 45 degrees with respect to the substrate surface, the emitted laser light 29 is reflected on the surface of the micro mirror region 23 to rise in a direction perpendicular to the substrate surface. The reflected laser light 29 is irradiated on, for example, an optical disk or the like and a part of the thus reflected light becomes incident light 22 to enter in the photodetector section 220.

The incident light 22 that enters in the photodetector section 220 is absorbed in the cathode surface layer 16 and the P⁻-type epitaxial layer 2, to generate electron hole pairs. When reverse bias voltage is applied to the photodetector section 220 at this time, a depletion layer is extended toward the P⁻-type epitaxial layer 2 where impurity concentration is low. The electron hole pairs generated in the extended depletion layer and the vicinity thereof diffuse and drift separately so that the electrons and the holes reach the cathode contact layer 17 and the anode contact layer 19, respectively, thereby generating a photocurrent. Namely, an optical signal is converted and output as an electric signal.

Referring to the features of the first embodiment, the P⁺-type anode buried layer 1a is selectively provided in the semiconductor substrate 1 and the P⁻-type epitaxial layer 2 only in the photodetector section 220. Accordingly, when a difference in impurity concentration between the semiconductor substrate 1 and the P⁺-type anode buried layer 1a is set to be three digits or more, the carriers generated in the semiconductor substrate 1 are inhibited from diffusion by a potential barrier generated due to concentration gradient and are re-coupled, with a result of no contribution to the photocurrent. Hence, the drift current becomes dominant, thereby enabling high-speed operation.

At the same time, the low concentration P⁻-type epitaxial layer 2 having the thickness of about 10 μm and the impurity concentration of about $1 \times 10^{14}$ cm⁻³ is completely depleted and has 80% or higher optical absorption rate to red and infrared light. As a result, a photodiode having high-speed operability and high photosensitivity to light having wavelengths from red to infrared is realized.

In addition, the P⁺-type anode buried layer 1a is not provided in the light emitting element section 240, and accordingly, no difference in impurity concentration is caused between the semiconductor substrate 1 and the P⁻-type epitaxial layer 2, both of which have low concentration. In this connection, no difference in etch rate, which is caused due to difference in impurity concentration, is caused in the process of forming the micro mirror region 23 by anisotropic etching using an alkaline solution, thereby preventing a line and a pit, which is developed due to crystal defect from an impurity in the high concentration P⁺-type anode buried layer 1a, in the mirror face portion. Thus, the micro mirror region 23, which is excellent in flatness, can be formed.

(First Fabrication Method in First Embodiment)

A first fabrication method of the optical semiconductor device constructed as above will be described below with reference to the drawings. FIG. 2A through FIG. 2F are sections showing the sequence of the first fabrication method of the optical semiconductor device according to the first embodiment of the present invention.

Figure 2A:
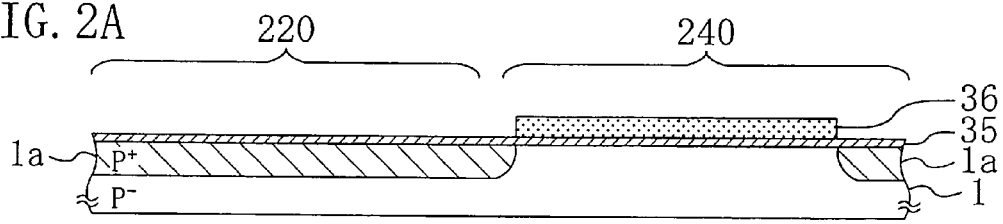
FIG. 2A through to FIG. 2F are sections showing the step sequence of a first fabrication method of the optical semiconductor device according to the first embodiment of the present invention.

First, as shown in FIG. 2A, a protection oxide film 35 made of silicon oxide is formed on the principal surface of a semiconductor substrate 1 made of P⁻-type silicon, and a resist pattern 36 as a mask for covering the protection oxide film 35 in a light emitting element section 240 is formed by a lithography method. Then, a P⁺-type anode buried layer 1a is formed selectively in a region of the semiconductor substrate 1 except the light emitting element section 240 by ion implantation of, for example, boron (B) ion as a P-type impurity to the semiconductor substrate 1 through the protection oxide film 35, using the resist pattern 36 as a mask. Herein, the dose amount of the boron ion is set to be $5 \times 10^{14}$ cm⁻² and the acceleration energy is set to be 30 keV, for example.

Figure 2B:
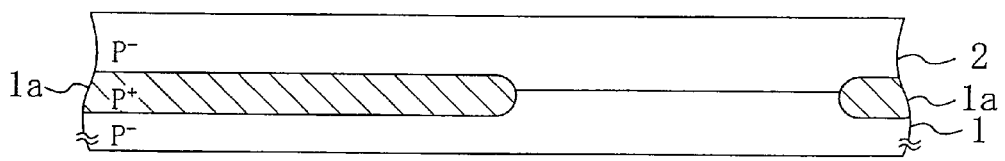

Subsequently, as shown in FIG. 2B, the resist pattern 36 is removed by ashing or the like, and thermal treatment, for example, at a temperature of about 1100° C. for about 30 minutes is performed on the semiconductor substrate 1 in which the boron ion is implanted to activate the implanted boron ion. Then, the protection oxide film 35 is removed by etching using an etching solution of which main component is hydrofluoric acid or an etching gas of which main component is fluorocarbon, and then, a P⁻-type anode epitaxial layer 2 of about 10 μm in thickness is formed by chemical vapor deposition (CVD) on the principal surface of the semiconductor substrate 1 in which the P⁺-type anode buried layer 1a is formed.

Figure 2C:
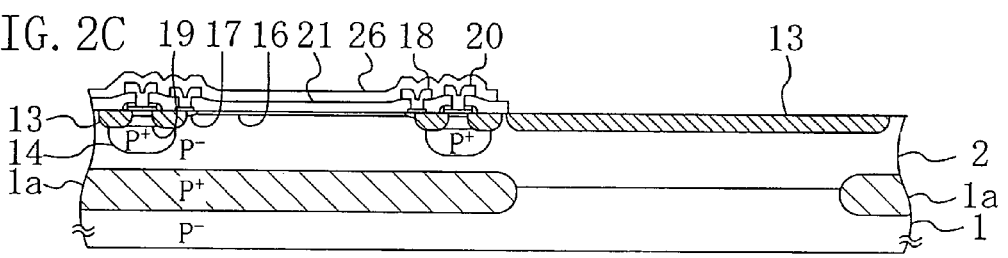

Next, as shown in FIG. 2C, a photodiode element and an isolation oxide film 13 are formed in the upper part of the P⁻-type epitaxial layer 2 respectively in the photodetector section 220 and the light emitting element section 240 by an ordinary photodiode formation step.

Referring to the photodiode, boron ion as a P-type impurity is implanted selectively in the upper part of the P⁻-type epitaxial layer 2 in the peripheral portion of the photodetector section 220 to have a concentration of $1 \times 10^{17}$ cm⁻³ to $1 \times 10^{18}$ cm⁻³, to form a P⁺-type isolation layer 14.

Subsequently, an isolation oxide film 13 made by LOCOS is formed in the upper part of the P⁻-type epitaxial layer 2 entirely in the light emitting element section 240 and other isolation oxide films 13 are formed double in the upper part of the P⁻-type epitaxial layer 2 on the P⁺-type isolation layer 4 in the light emitting element section 220, with an interval left therebetween.

Next, a P-type polysilicon layer is selectively formed between the isolation oxide films 13 in the upper part of the P⁻-type epitaxial layer 2 to form a P-type anode contact layer 19 between the isolation oxide films 13 in the upper part of the P⁻-type epitaxial layer 2 by solid phase diffusion from the thus formed polysilicon layer.

Subsequently, a N-type polysilicon layer is formed on the P⁻-type epitaxial layer 2 to form a N-type cathode contact layer 17 by solid phase diffusion form the thus formed polysilicon layer. Then, a N⁺-type cathode surface layer 16 is formed by ion implantation with arsenic (As) or phosphorous (P) ion to a region surrounded by the inner isolation oxide film 13 in the upper part of the P⁻-type epitaxial layer 2.

Next, a cathode electrode 18 and an anode electrode 20 are formed on the N-type polysilicon layer and the P-type polysilicon layer, respectively. It is noted that a lamination structure of a metal layer of which main component is titanium (Ti) and a metal layer of which main component is aluminum (Al) can be employed as a material of each electrode 18, 20. Then, an anti-reflection film 21 made of, for example, silicon oxide is formed on at least the cathode surface layer 16, and a protection film 26 is formed on the anti-reflection film 21 by CVD.

Figure 2D:
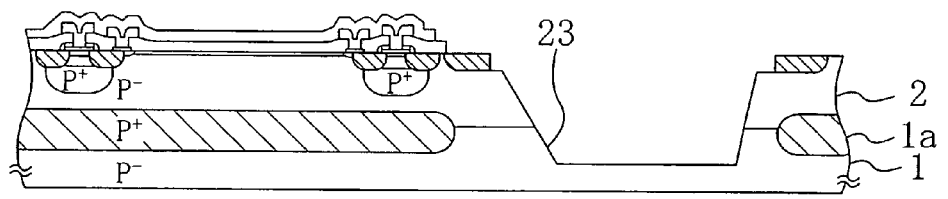

Subsequently, as shown in FIG. 2D, a trench formation region in the isolation oxide film 13 formed in the light emitting element section 240 is selectively etched and removed, whereby a opening pattern for opening the trench formation region is formed in a region of the isolation oxide film 13 in the light emitting element section 240. Then, a trench is formed by anisotropic wet etching on the P⁻-type epitaxial layer 2 and P⁻-type semiconductor substrate 1 with an alkaline solution such as an aqueous solution of potassium hydroxide (KOH), using as a mask the isolation oxide film 13 of the opening pattern which remains in the light emitting element section 240, and then, a micro mirror region 23 is formed at the wall face of the thus formed trench. It is noted that a (111) plane in orientation of silicon has the latest silicon etch rate of alkaline solutions, and therefore, the (111) plane becomes as the mirror face of the micro mirror region 23. Wherein, in the case where the orientation of the principal surface of the semiconductor substrate 1 made of silicon is in a (100) plane, the angle between the wall face and the bottom face of the trench is 54.7 degrees, as conventionally known. Accordingly, when an inclined substrate that inclines 9.7 degrees from the (100) plane as the orientation of the principal surface of the semiconductor substrate 1 is used, namely, an offset substrate is used, the angle between the wall face and the bottom face of the trench is 45 degrees. Thus, the micro mirror region 23 can form the angle of 45 degrees with respect to the principal surface of the semiconductor substrate 1, and accordingly, a light path of the laser light emitted in parallel to the substrate surface can be changed in a direction perpendicular to the substrate surface.

Figure 2E:
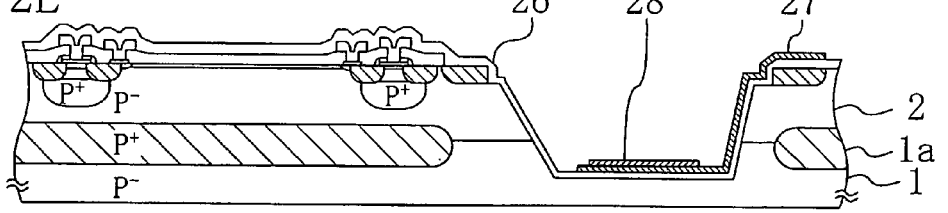

Next, as shown in FIG. 2E, a protection film 26 is formed by CVD so as to cover the exposed face of the light emitting element region 240 in which the micro mirror region 23 of the trench is formed. Then, a laser wire 27 of which main component is, for example, gold (Au) is formed by a vapor deposition method or a sputtering method so as to extend from the bottom face to the outside of the trench. Thereafter, a laser lower electrode 28 is selectively formed on the laser wire 27 on the bottom face of the trench by a deposition method, a sputtering method, a field-effect plating method or the like.

Figure 2F:
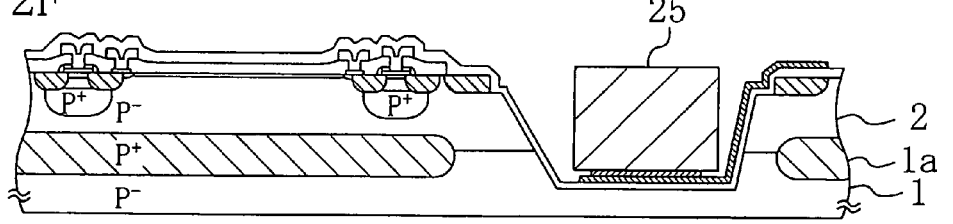

Subsequently, as shown in FIG. 2F, a semiconductor laser chip 25 is bonded on the laser lower electrode 28, thereby obtaining the optical semiconductor device according to the first embodiment.

(Second Fabrication Method in First Embodiment)

A second fabrication method of the optical semiconductor device according to the first embodiment will be described below with reference to FIG. 3A through FIG. 3D. In the second fabrication method, a P⁺-type anode buried layer 1a is formed after a P⁻-type epitaxial layer 2 is formed on the principal surface of a semiconductor substrate 1.

Figure 3A:
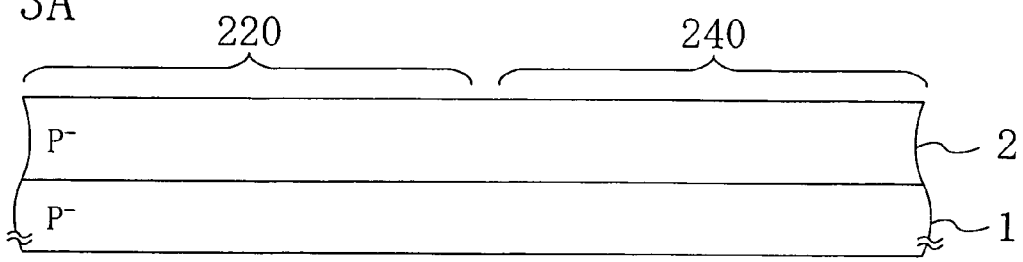
FIG. 3A through to FIG. 3D are sections showing the step sequence of a second fabrication method of the optical semiconductor device according to the first embodiment of the present invention.

First, as shown in FIG. 3A, the P⁻-type epitaxial layer 2 of about 10 μm in thickness is formed on the principal surface of the semiconductor substrate 1 by CVD.

Figure 3B:
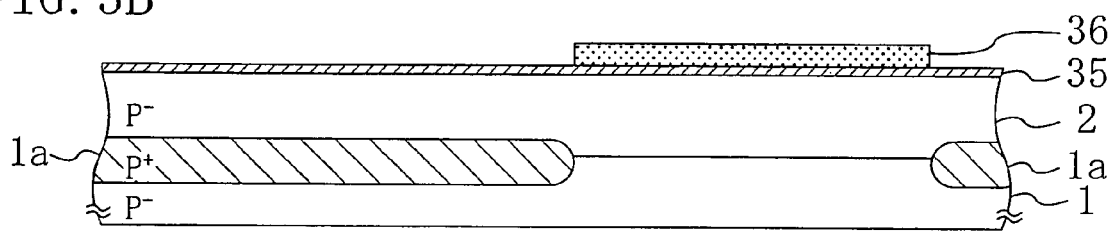

Next, as shown in FIG. 3B, a protection oxide film 35 made of silicon oxide is formed on the P⁻-type epitaxial layer 2, and a resist pattern 36 as a mask for covering the protection oxide film 35 in a light emitting element section 240 is formed by a lithography method. Then, a P⁺-type anode buried layer 1a is formed selectively in a region between the semiconductor substrate 1 and the P⁻-type epitaxial layer 2 except the light emitting element section 240 by ion implantation of, for example, boron (B) ion as a P-type impurity to the semiconductor substrate 1 through the protection oxide film 35 and the P⁻-type epitaxial layer 2, using the resist pattern 36 as a mask. Herein, the dose amount of the boron ion is set to be $5 \times 10^{14}$ cm$^{-2}$ and the acceleration energy is set to be 2 MeV, for example. Thereafter, the resist pattern 36 is removed by ashing or the like, and thermal treatment, for example, at a temperature of about 1100° C. for about 30 minutes is performed on the semiconductor substrate 1 in which the boron ion is implanted to activate the boron ions.

Figure 3C:
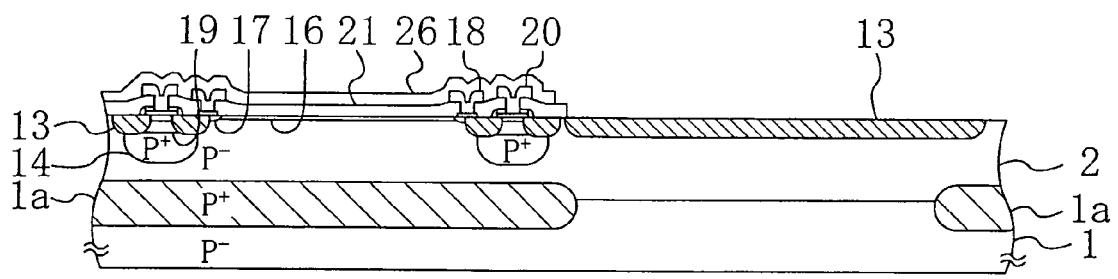

Subsequently, as shown in FIG. 3C, after the protection oxide film 35 is removed, an isolation oxide film 13 is formed in the P⁻-type epitaxial layer 2 in the photodetector section 220 selectively and an isolation oxide film 13 is formed in the P⁻-type epitaxial layer 2 in the light emitting element section 240 entirely.

Figure 3D:
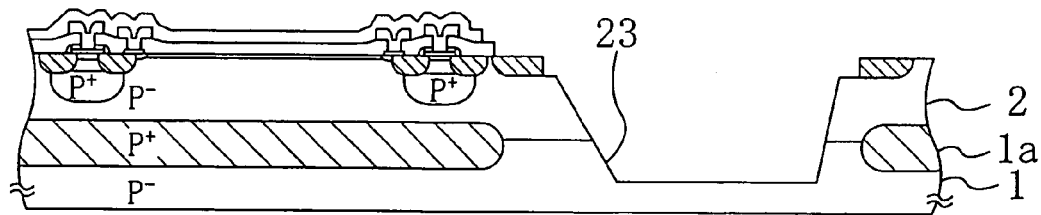

Next, as shown in FIG. 3D, a photodiode is formed in the photodetector section 220, and a micro mirror region 23 of a trench is formed in the light emitting element section 240 by etching using the isolation oxide film 13 remaining in the light emitting element section 240 as a mask. Thereafter, likewise the first fabrication method, a semiconductor laser chip 25 is bonded on the bottom face of the trench, thereby obtaining the optical semiconductor device according to the first embodiment.

Second Embodiment

The second embodiment of the present invention will be described below with reference to the drawings.

Figure 4:
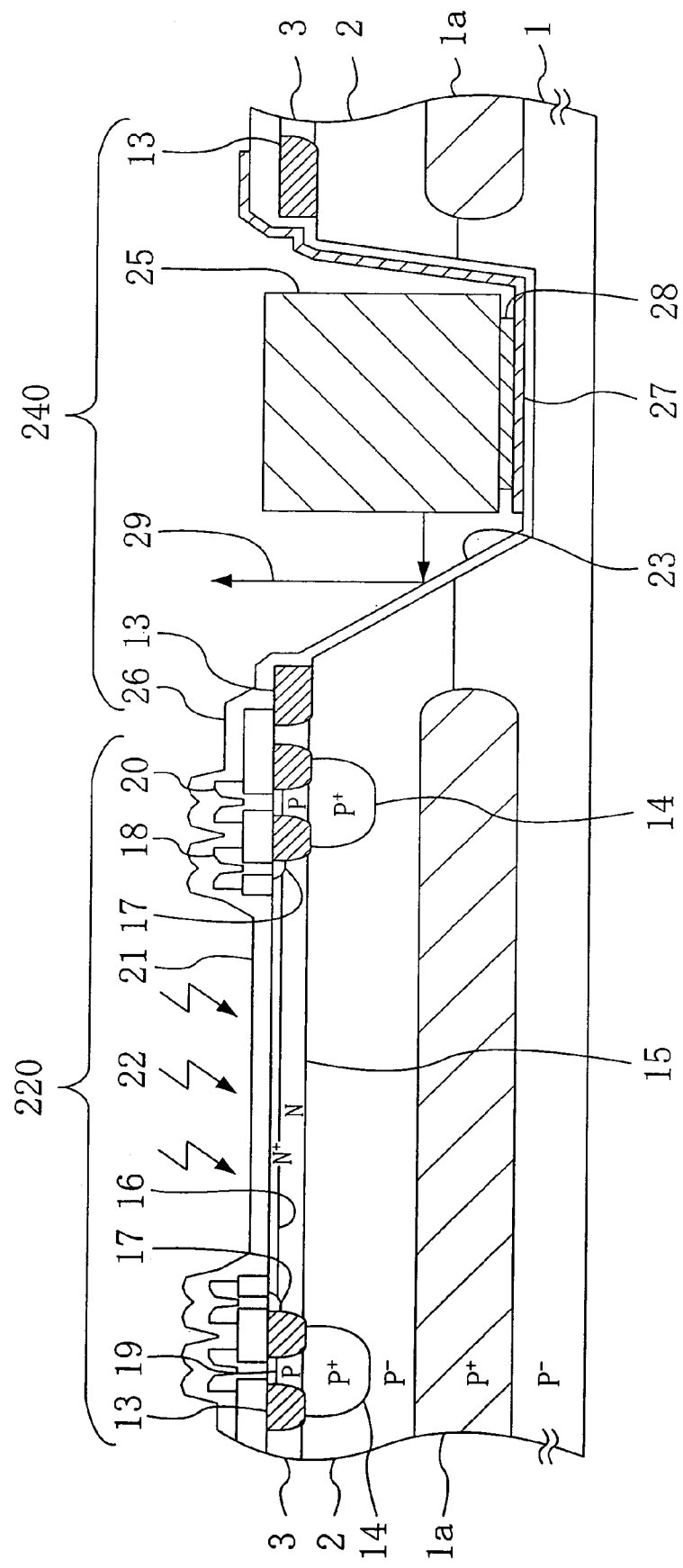
FIG. 4 shows a schematic construction in section of an optical semiconductor device according to the second embodiment of the present invention.

FIG. 4 shows a schematic construction in section of an optical semiconductor device (OEIC device) according to the second embodiment of the present invention. In FIG. 4, the same reference numerals are assigned to the same members as those in FIG. 1 and the description thereof is omitted. In the optical semiconductor device according to the second embodiment, the N-type epitaxial layer 3 is provided on the P⁻-type epitaxial layer 2.

Accordingly, a cathode in the photodiode composing the photodetector section 220 is composed of the cathode layer 25 of the N-type epitaxial layer 3 and the cathode surface layer 16 formed in the upper part of the cathode layer 15. Herein, the impurity concentration of the cathode surface layer 16 is set to be three-digit larger, that is, $10^3$ times larger than the impurity concentration of the cathode layer 3 so as to enhance the efficiency of photoelectric conversion, with a result of enhancement of the photosensitivity and the frequency characteristic to incident light 22 absorbed in the vicinity of the surface portion of the cathode layer 15.

Similar to the first embodiment, the P⁺-type anode buried layer 1a is not provided in the light emitting element section 240, and accordingly, no difference in impurity concentration is caused between the semiconductor substrate 1 and the P⁻-type epitaxial layer 2, both of which have low concentration. In this connection, no difference in etch rate, which is caused due to difference in impurity concentration, is caused in the process of forming the micro mirror region 23 by anisotropic etching using an alkaline solution, thereby preventing a line and a pit, which is developed due to crystal defect from an impurity in the high concentration P⁺-type anode buried layer 1a, in the mirror face. Thus, the micro mirror region 23, which is excellent in flatness, can be formed.

(First Fabrication Method in Second Embodiment)

A first fabrication method of the optical semiconductor device as constructed as above will be described below with reference to the drawings. FIG. 5A through FIG. 5G are sections showing the sequence of the first fabrication method of the optical semiconductor device according to the second embodiment of the present invention.

First, as shown in FIG. 5A, likewise the first fabrication method in the first embodiment, a protection oxide film 35 made of silicon oxide is formed on the principal surface of a semiconductor substrate 1 made of P⁻-type silicon, and a resist pattern 36 as a mask for covering the protection oxide film 35 in a light emitting element section 240 is formed. Then, a P⁺-type anode buried layer 1a is formed selectively in a region of the semiconductor substrate 1 except the light emitting element section 240 by ion implantation of, for example, boron (B) ion as a P-type impurity to the semiconductor substrate 1 through the protection oxide film 35, using the resist pattern 36 as a mask.

Subsequently, as shown in FIG. 5B, the resist pattern 36 is removed, and thermal treatment, for example, at a temperature of about 1100° C. for about 30 minutes is performed to activate the implanted boron ion. Then, the protection oxide film 35 is removed, and a P⁻-type anode epitaxial layer 2 of about 10 μm in thickness is formed by CVD on the principal surface of the semiconductor substrate 1 in which the P⁺-type anode buried layer 1a is formed.

Next, as shown in FIG. 5C, a high concentration P⁺-type isolation layer 14 functioning as a part of an anode is formed selectively in the peripheral portion of the photodetector section 220 in the upper part of the P⁻-type epitaxial layer 2 by ion implantation. Then, a N-type epitaxial layer 3 in which phosphorous (P) ion as a N-type impurity is introduced at a concentration of about $1 \times 10^{16}$ cm⁻³ is grown by CVD to have a thickness of, for example, about 1.0 μm.

Subsequently, as shown in FIG. 5D, an isolation oxide film 13 is formed selectively in the N-type epitaxial layer 3 in the photodetector section 220 and another isolation oxide film 13 is formed entirely in the N-type epitaxial layer 3 in the light emitting element section 240. Then, a photodiode is formed in the photodetector section 220, likewise the first embodiment.

Next, as shown in FIG. 5E, anisotropic wet etching using an alkaline etching solution containing KOH or the like is performed on the P⁻-type epitaxial layer 2 and the upper part of the semiconductor substrate 1, using the isolation oxide film 13 remaining in the light emitting element section 240 as a mask for trench formation, to form a micro mirror region 23 of a trench in the light emitting element section 240.

Subsequently, as shown in FIG. 5F, a laser wire 27 extending from the bottom face of the trench to the upper face of the N-type epitaxial layer 3 and a laser lower electrode 28 on the laser wire 27 on the bottom face of the trench are formed selectively.

Next, as shown in FIG. 5G, a semiconductor laser chip 25 is bonded on the laser lower electrode 28, thereby obtaining the optical semiconductor device according to the second embodiment.

(Second Fabrication Method in Second Embodiment)

A second fabrication method of the optical semiconductor device according to the second embodiment will be described below with reference to FIG. 6A through FIG. 6E. In the second fabrication method, a P⁺-type anode buried layer 1a and a N-type epitaxial layer 3 are formed after a P⁻-type epitaxial layer 2 is formed on the principal surface of a semiconductor substrate 1.

Figure 6A:
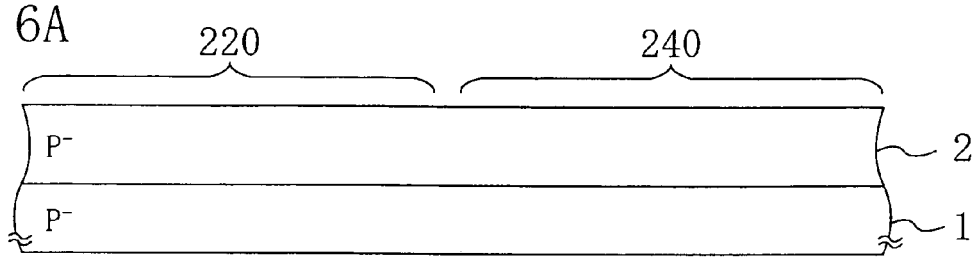
FIG. 6A through to FIG. 6E are sections showing the step sequence of a second fabrication method of the optical semiconductor device according to the second embodiment of the present invention.

First, as shown in FIG. 6A, a P⁻-type epitaxial layer 2 is grown on the principal surface of the semiconductor substrate 1 by CVD to have a thickness of about 10 μm.

Figure 6B:
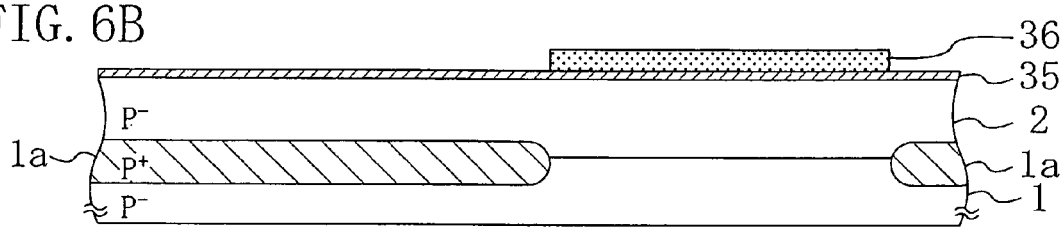

Next, as shown in FIG. 6B, a protection oxide film 35 made of silicon oxide is formed on the P⁻-type epitaxial layer 2, and a resist pattern 36 as a mask for covering the protection oxide film 35 in a light emitting element section 240 is formed by a lithography method. Then, a P⁺-type anode buried layer 1a is formed selectively in a region between the semiconductor substrate 1 and the P⁻-type epitaxial layer 2 except the light emitting element section 240 by ion implantation of, for example, boron (B) ion as a P-type impurity to the semiconductor substrate 1 through the protection oxide film 35 and the P⁻-type epitaxial layer 2, using the resist pattern 36 as a mask. Herein, the dose amount of the boron ion is set to be $5 \times 10^{14}$ cm⁻² and the acceleration energy is set to be 2 MeV, for example. Thereafter, the resist pattern 36 is removed by ashing or the like, and thermal treatment, for example, at a temperature of about 1100° C. for about 30 minutes is performed on the semiconductor substrate 1 in which the boron ion is implanted to activate the boron ions.

Figure 6C:
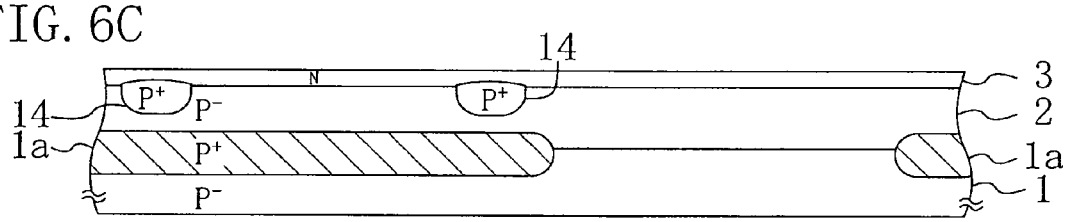

Subsequently, as shown in FIG. 6C, a high concentration P⁺-type isolation layer 14 functioning as a part of an anode is formed selectively by ion implantation in the upper part of the P⁻-type epitaxial layer 2 in the peripheral portion of the photodetector section 220. Then, a N-type epitaxial layer 3 in which phosphorous (P) ion as a N-type impurity is introduced at a concentration of about $1 \times 10^{16}$ cm⁻³ is formed by CVD to have a thickness of about 1.0 μm.

Figure 6D:
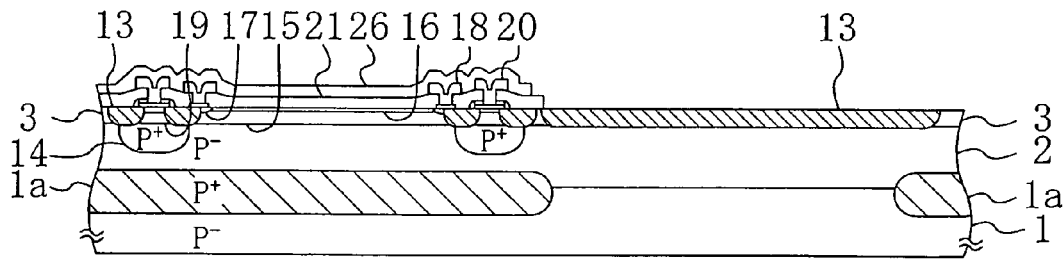

Next, as shown in FIG. 6D, an isolation oxide film 13 is selectively formed in the upper part of the N-type epitaxial layer 3 in the photodetector section 220 so as to cover a part of P⁺-type isolation layer 14. Simultaneously, another isolation oxide film 13 is formed entirely in the upper part of the N-type epitaxial layer 3 in the light emitting element section 240. Then, a photodiode is formed in the photodetector section 220, likewise the first embodiment.

Figure 6E:
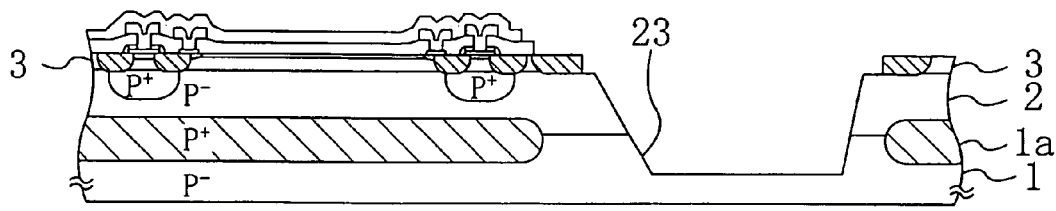

Subsequently, as shown in FIG. 6E, anisotropic etching is performed on the P⁻-type epitaxial layer 2 and the upper part of the semiconductor substrate 1 in the light emitting element section 240, using the isolation oxide film 13 remaining in the light emitting element section 240, to form a trench in the P⁻-type epitaxial layer 2 and the upper part of the semiconductor substrate 1, thereby obtaining a micro mirror region 23. Thereafter, a semiconductor laser chip 25 is bonded on the bottom face of the trench, likewise the first fabrication method, to obtain the optical semiconductor device according to the second embodiment.

Third Embodiment

The third embodiment of the present invention will be described below with reference to the drawings.

Figure 7:
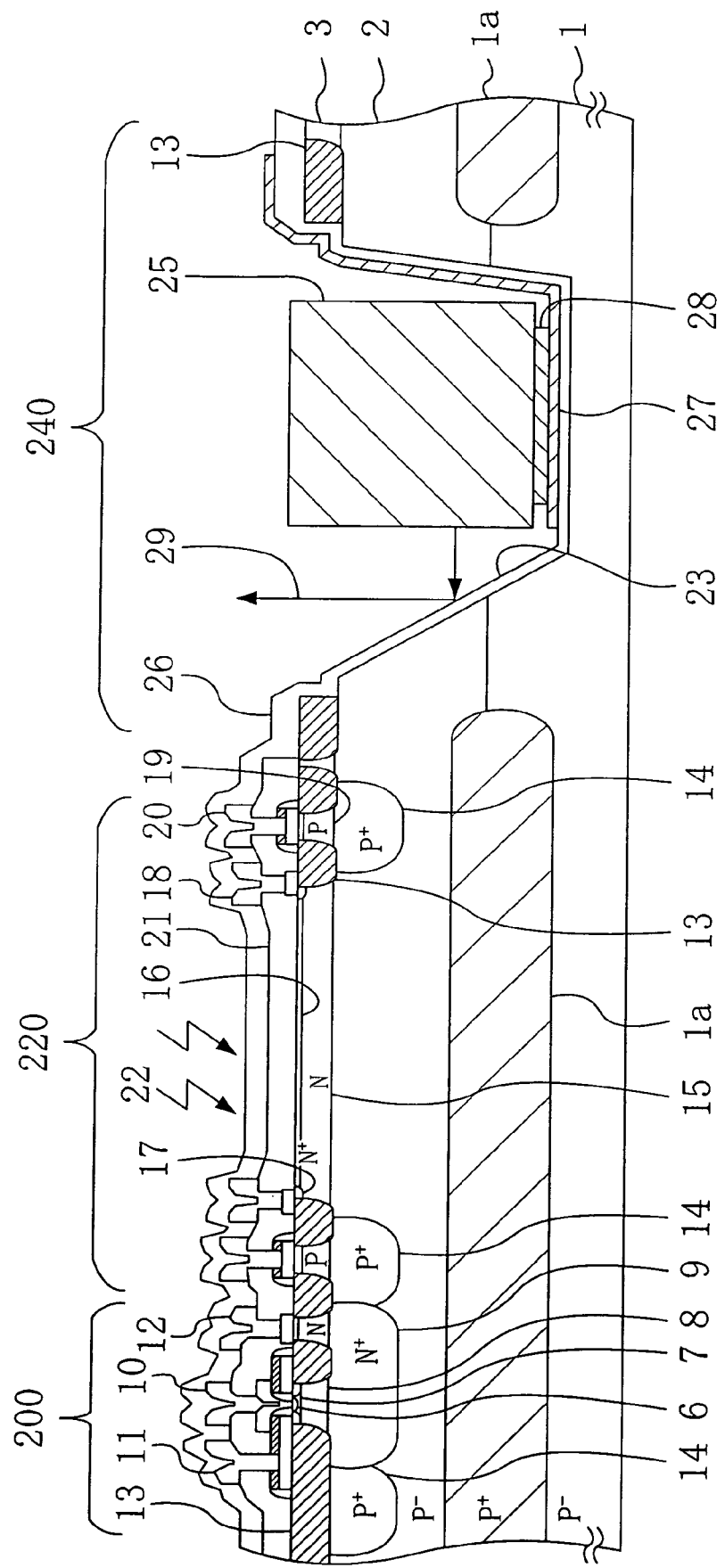
FIG. 7 shows a schematic construction in section of an optical semiconductor device according to the third embodiment of the present invention.

FIG. 7 shows a schematic construction in section of an optical semiconductor device (OEIC device) according to the third embodiment of the present invention. In FIG. 7, the same reference numerals are assigned to the same members as those in FIG. 4 and the description thereof is omitted. In the optical semiconductor device according to the third embodiment, a transistor section 200 composed of a NPN bipolar transistor is formed in the epitaxial substrate composed of the P⁻-type epitaxial layer 2 and the N-type epitaxial layer 3, which composes the optical semiconductor device according to the second embodiment, in addition to the photodetector section 220 and the light emitting element section 240.

The addition of the transistor section 200 allows an output signal from the photodiode of the photodetector section 220 to be input to the NPN transistor and further to an electronic circuit composed of a resistance element and a capacitance element (not shown). Then, the thus input signal is amplified and is signal-processed by the electronic circuit, and then, is output as a recording or replay signal of an optical disk.

The transistor section 200 is a tow-layer polysilicon self aligned type NPN bipolar transistor and is formed outside the isolation oxide film 13 located opposite the light emitting element section 240 with respect to the photodetector section 220 in the P$^-$-type epitaxial layer 2 and the N-type epitaxial layer 3.

Referring to the detailed construction of the transistor section 200, it includes: a high concentration N-type emitter region 6 formed selectively in the upper part of the N-type epitaxial layer 3 by solid phase diffusion; a P-type base region 7 formed under the emitter region 6; a collector region 8 made of the N-type epitaxial layer 3 and formed below the base region 7; a high concentration N-type collector buried region 9 formed below the collector region 8; an emitter electrode 10 formed on the emitter region 6; a base electrode 11 connected electrically to the peripheral portion of the base region 7; and a collector electrode 12 formed above the collector buried region 9 and connected electrically to the end part of the collector buried region 9. Wherein, the two-layer polysilicon self aligned type means, for example, a structure in which: a P-type polysilicon is intervened between the P-type base region 7 and the base electrode 11 to solid-phase diffuse a P-type impurity from the polysilicon layer to the upper part of the N-type epitaxial layer 3, thereby forming a P-type base contact layer in the upper part of the N-type epitaxial layer 3; while a N-type polysilicon layer is intervened between the N-type collector buried layer 9 and the collector electrode 12 to solid-phase diffuse a N-type impurity from the polysilicon layer to the upper part of the N-type epitaxial layer 3, thereby forming a N-type collector contact layer in the upper part of the N-type epitaxial layer 3.

As described above, in the third embodiment, the transistor section 200 and the photodetector section 220 are formed on a single semiconductor substrate 1, and therefore, the wiring distance between the photodetector section 220 and an electronic circuit becomes shorter than those in the first and second embodiments. As a result, parasitic capacitance and inductance can be reduced, which enhances the frequency characteristic in the optical semiconductor device and is advantageous in high-speed operation. Further, the transistor section 200, the photodetector section 220 and the light emitting element section 240 can be integrated in a single substrate, thereby enabling size reduction of the optical semiconductor device.

In addition, similar to the first embodiment, the P$^+$-type anode buried layer 1a is not provided in the light emitting element section 240, and accordingly, no difference in impurity concentration is caused between the semiconductor substrate 1 and the P$^-$-type epitaxial layer 2, both of which have low concentration. In this connection, no difference in etch rate, which is caused due to difference in impurity concentration, is caused in the process of forming the micro mirror region 23 by anisotropic etching using an alkaline solution, thereby preventing a line and a pit, which is developed due to crystal defect from an impurity in the high concentration P$^+$-type anode buried layer 1a, in the mirror face. Thus, the micro mirror region 23, which is excellent in flatness, can be formed.

(First Fabrication Method in Third Embodiment)

A first fabrication method of the optical semiconductor device constructed as above will be described below with reference to the drawings. FIG. 8A through FIG. 8G are sections showing the sequence of the first fabrication method of the optical semiconductor device according to the third embodiment of the present invention.

Figure 8A:
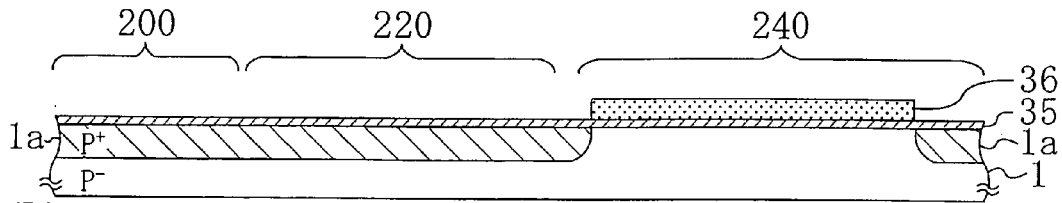
FIG. 8A through to FIG. 8G are sections showing the step sequence of a first fabrication method of the optical semiconductor device according to the third embodiment of the present invention.

First, as shown in FIG. 8A, likewise the first fabrication method in the first embodiment, a protection oxide film 35 made of silicon oxide is formed on the principal surface of a semiconductor substrate 1 made of P$^-$-type silicon, and a resist pattern 36 as a mask for covering the protection oxide film 35 in a light emitting element section 240 is formed. Then, a P$^+$-type anode buried layer 1a is formed selectively in a region of the semiconductor substrate 1 except the light emitting element section 240 by ion implantation of, for example, boron (B) ion as a P-type impurity to the semiconductor substrate 1 through the protection oxide film 35, using the resist pattern 36 as a mask.

Figure 8B:
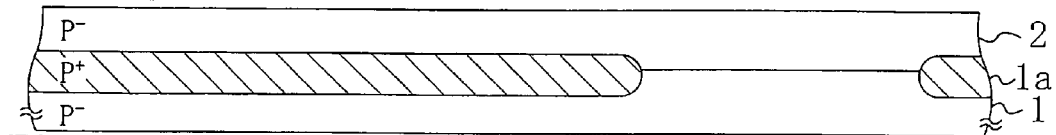

Subsequently, as shown in FIG. 8B, after the resist pattern 36 and the protection oxide film 35 are removed, a P$^-$-type epitaxial layer 2 is grown by CVD on the principal surface of the semiconductor substrate 1, in which the P$^+$-type anode buried layer 1a is formed, to have a thickness of about 10 μm. Then, thermal treatment, for example, at a temperature of about 1100° C. for about 30 minutes is performed on the semiconductor substrate 1 on which the P$^-$-type epitaxial layer 2 is formed to activate the implanted boron ion.

Figure 8C:
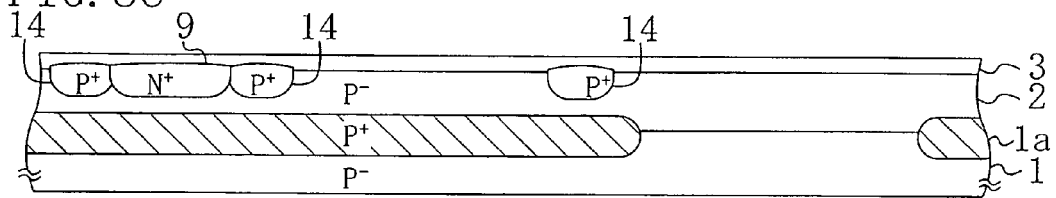

Next, as shown in FIG. 8C, ion implantation of, for example, arsenic (As) ion as a N-type impurity is performed selectively on a region of the P$^-$-type epitaxial layer 2 between P$^+$-type isolation layer formation portions in the transistor section 200 to form a collector buried region 9 in a region between the P$^+$-type isolation layer formation portions in the P$^-$-type epitaxial layer 2 in the transistor section 200. Herein, the dose amount of arsenic ion is set to be $1\times10^{16}$ cm$^{-2}$ and the acceleration energy is set to be 40 keV. Then, high concentration P$^+$-type isolation layers 14 functioning as a part of an anode are formed selectively in the P$^-$-type epitaxial layer 2 in the peripheral portion of the photodetector 220 by ion implantation. Wherein, one of the P$^+$-type isolation layers 14 which is located in the boundary portion between the transistor section 200 and the photodetector section 220 is used in common to the transistor section 200 and the photodetector section 220. Thereafter, a N-type epitaxial layer 3 in which, for example, phosphorous (P) ion as a N-type impurity is implanted at a concentration of $1\times10^{16}$ cm$^{-3}$ is grown by CVD to have a thickness of, for example, about 1.0 μm.

Figure 8D:
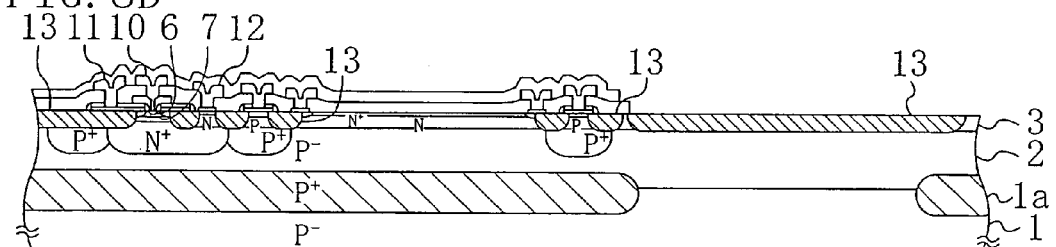

Subsequently, as shown in FIG. 8D, an isolation oxide film 13 is formed selectively in the N-type epitaxial layer 3 in the transistor section 200 and the light emitting element section 220 and another isolation oxide film 13 is formed entirely in the N-type epitaxial layer 3 in the light emitting element section 240. Then, a NPN transistor is formed in the transistor section 200 and a photodiode is formed in the photodetector section 220. In the NPN transistor, for example, a P-type base region 7 is formed selectively in the upper part of the N-type epitaxial layer 3, and then, a N-type emitter region 6 is formed selectively in a part of the upper part of the base region 7 in the N-type epitaxial layer 3. Thereafter, an emitter electrode 10, a base electrode 11 and a collector electrode 12 are formed sequentially. Further, a photodiode in the photodetector section 220 is formed, likewise the first embodiment.

Figure 8E:
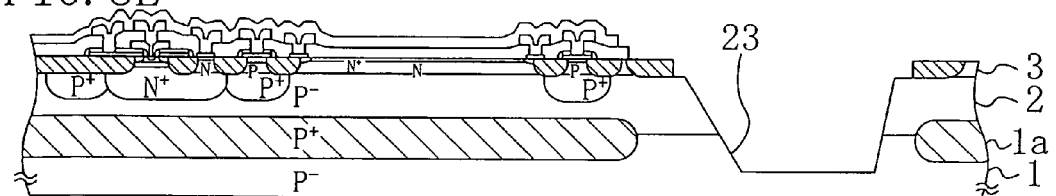

Next, as shown in FIG. 8E, anisotropic wet etching using an alkaline etching solution containing KOH or the like is performed on the P$^-$-type epitaxial layer 2 and the upper part of the semiconductor substrate 1, using the isolation oxide film 13 remaining in the light emitting element section 240 as a mask for trench formation, to form a micro mirror region 23 of a trench in the light emitting element section 240.

Figure 8F:
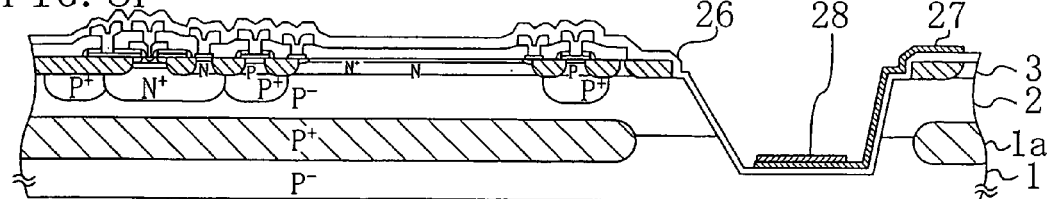

Subsequently, as shown in FIG. 8F, a laser wire 27 extending from the bottom face of the trench to the upper face of the N-type epitaxial layer 3, and a laser lower electrode 28 on the laser wire 27 on the bottom face of the trench are formed selectively.

Figure 8G:
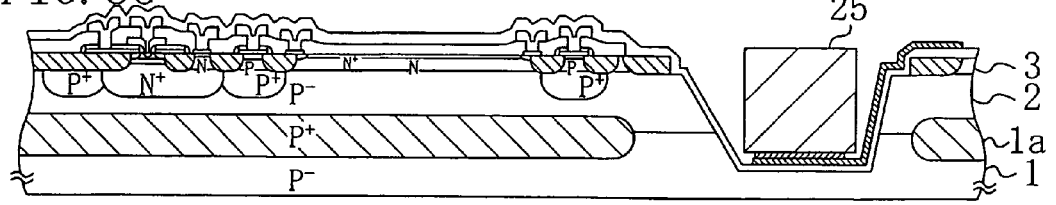

Next, as shown in FIG. 8G, a semiconductor laser chip 25 is bonded on the laser lower electrode 28, thereby obtaining the optical semiconductor device according to the third embodiment.

(Second Fabrication Method in Third Embodiment)

A second fabrication method of the optical semiconductor device according to the third embodiment will be described below with reference to FIG. 9A through FIG. 9E. In the second fabrication method, a P$^+$-type anode buried layer 1$a$ and a N-type epitaxial layer 3 are formed after a P$^-$-type epitaxial layer 2 is formed on the principal surface of a semiconductor substrate 1.

Figure 9A:
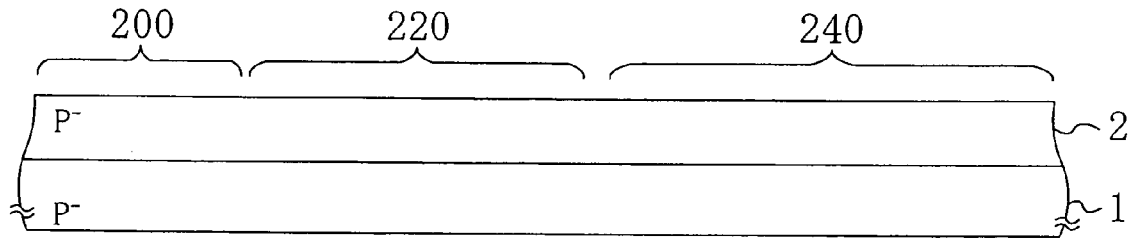
FIG. 9A through to FIG. 9E are sections showing the step sequence of a second fabrication method of the optical semiconductor device according to the third embodiment of the present invention.

First, as shown in FIG. 9A, a P$^-$-type epitaxial layer 2 is grown on the principal surface of the semiconductor substrate 1 by CVD to have a thickness of about 10 μm.

Figure 9B:
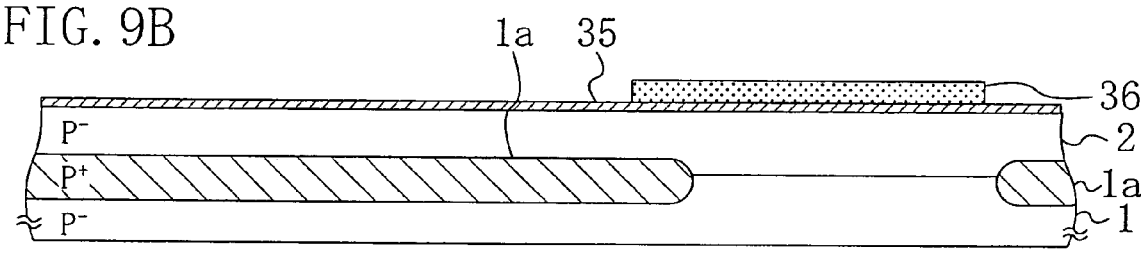

Next, as shown in FIG. 9B, a protection oxide film 35 made of oxide silicon is formed on the P$^-$-type epitaxial layer 2, and a resist pattern 36 as a mask for covering the protection oxide film 35 in a light emitting element section 240 is formed by a lithography method. Then, a P$^+$-type anode buried layer 1$a$ is formed selectively in a region between the semiconductor substrate 1 and the P$^-$-type epitaxial layer 2 except the light emitting element section 240 by ion implantation of, for example, boron (B) ion as a P-type impurity to the semiconductor substrate 1 through the protection oxide film 35 and the P$^-$-type epitaxial layer 2, using the resist pattern 36 as a mask. Herein, the dose amount of the boron ion is set to be $5 \times 10^{14}$ cm$^{-2}$ and the acceleration energy is set to be 2 MeV, for example. Thereafter, the resist pattern 36 is removed by ashing or the like, and thermal treatment, for example, at a temperature of about 1100° C. for about 30 minutes is performed on the semiconductor substrate 1 in which the boron ion is implanted to activate the boron ion.

Figure 9C:
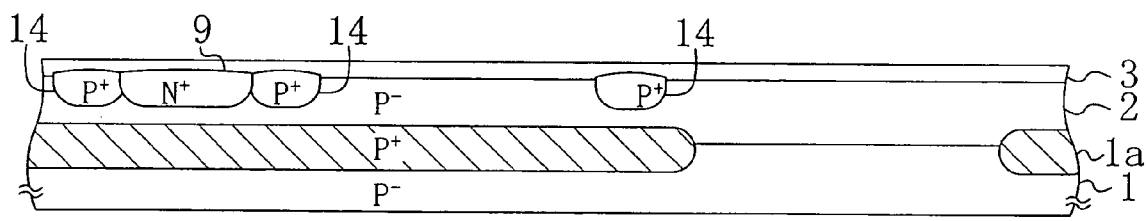

Subsequently, as shown in FIG. 9C, a collector buried region 9 is formed in a region of the transistor section 200 between P$^+$-type isolation layer formation portions in the P$^-$-type epitaxial layer 2 by selective ion implantation of, for example, arsenic (As) ion as a N-type impurity to a region of the transistor section 200 between the P$^+$-type isolation layer formation portions in the P$^-$-type epitaxial layer 2. Herein, the dose amount of the arsenic ion is set to be $1 \times 10^{16}$ cm$^{-2}$ and the acceleration energy is set to be 40 MeV, for example. Then, high concentration P$^+$-type isolation layers 14 functioning as a part of an anode are formed by ion implantation selectively in the upper part of the P$^-$-type epitaxial layer 2 in the peripheral portion of the photodetector section 220. Wherein, one of the P$^+$-type isolation layers 14 which is located in the boundary portion of the transistor section 200 and the photodetector section 220 is used in common to the transistor section 200 and the photodetector section 220. Then, after the protection oxide film 35 is removed, a N-type epitaxial layer 3 in which phosphorous (P) ion as a N-type impurity is introduced at a concentration of about $1 \times 10^{16}$ cm$^{-3}$ is grown on the P$^-$-type epitaxial layer 2 by CVD to have a thickness of about 1.0 μm.

Figure 9D:
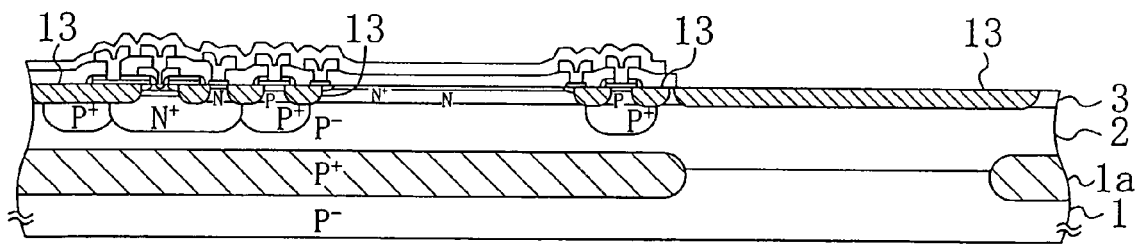

Next, as shown in FIG. 9D, an isolation oxide film 13 is selectively formed in the upper part of the N-type epitaxial layer 3 in the transistor section 200 and the photodetector section 220 and another isolation oxide film 13 is formed entirely in the upper part of the N-type epitaxial layer 3 in the light emitting element section 240. Then, a NPN transistor is formed in the transistor section 200 and a photodiode is formed in the photodetector section 220.

Figure 9E:
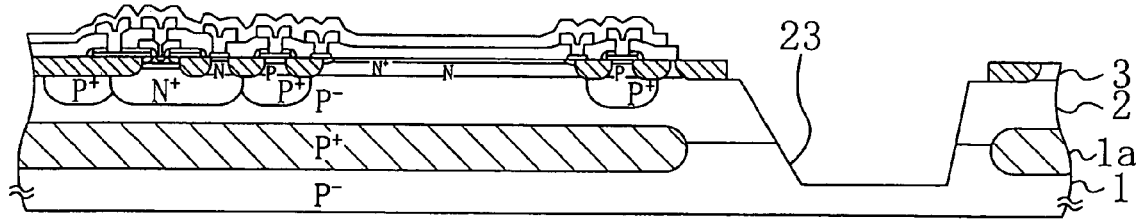
Figure 10:
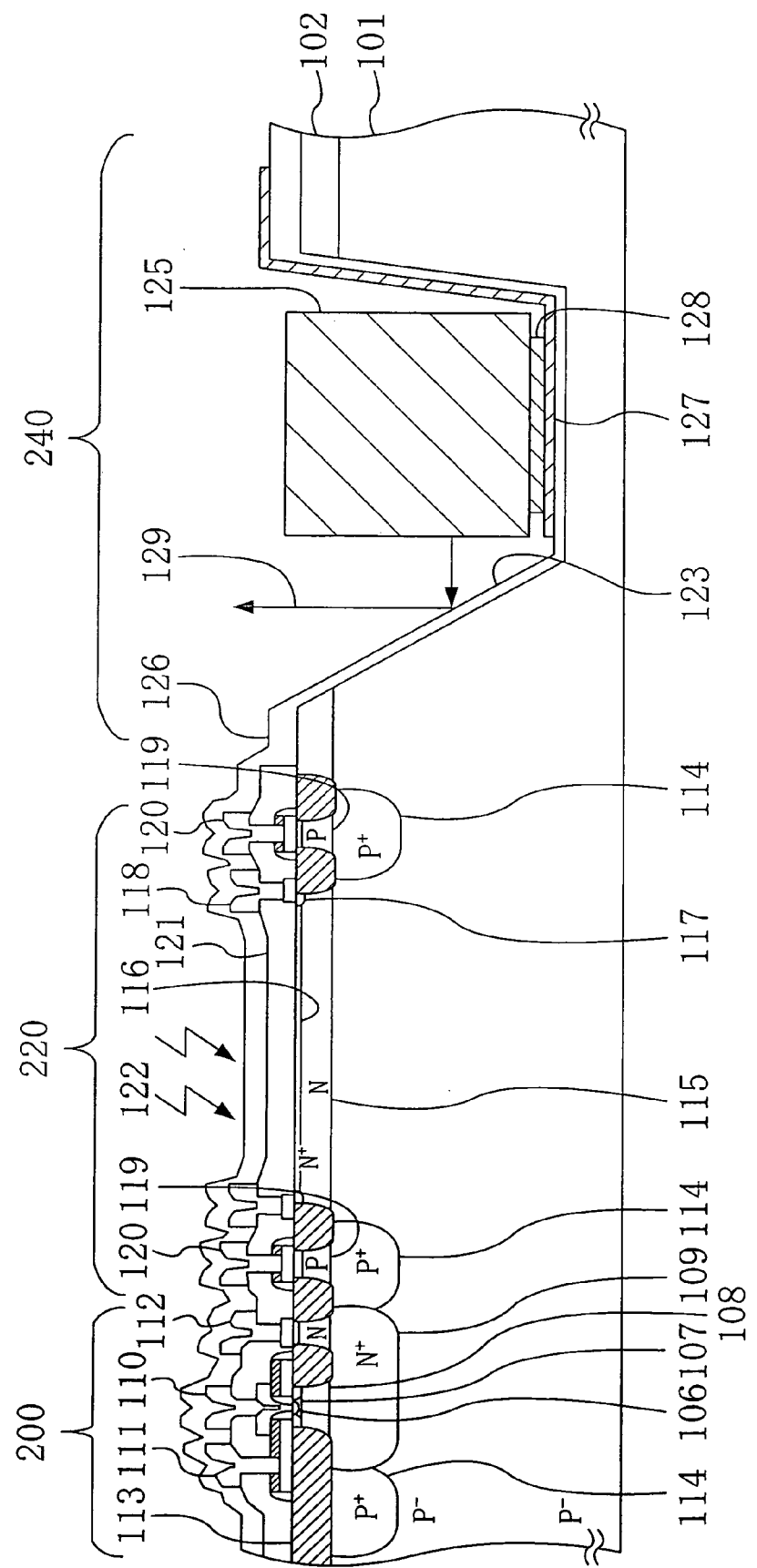
FIG. 10 shows a schematic construction in section of a conventional optical semiconductor device.
Figure 11:
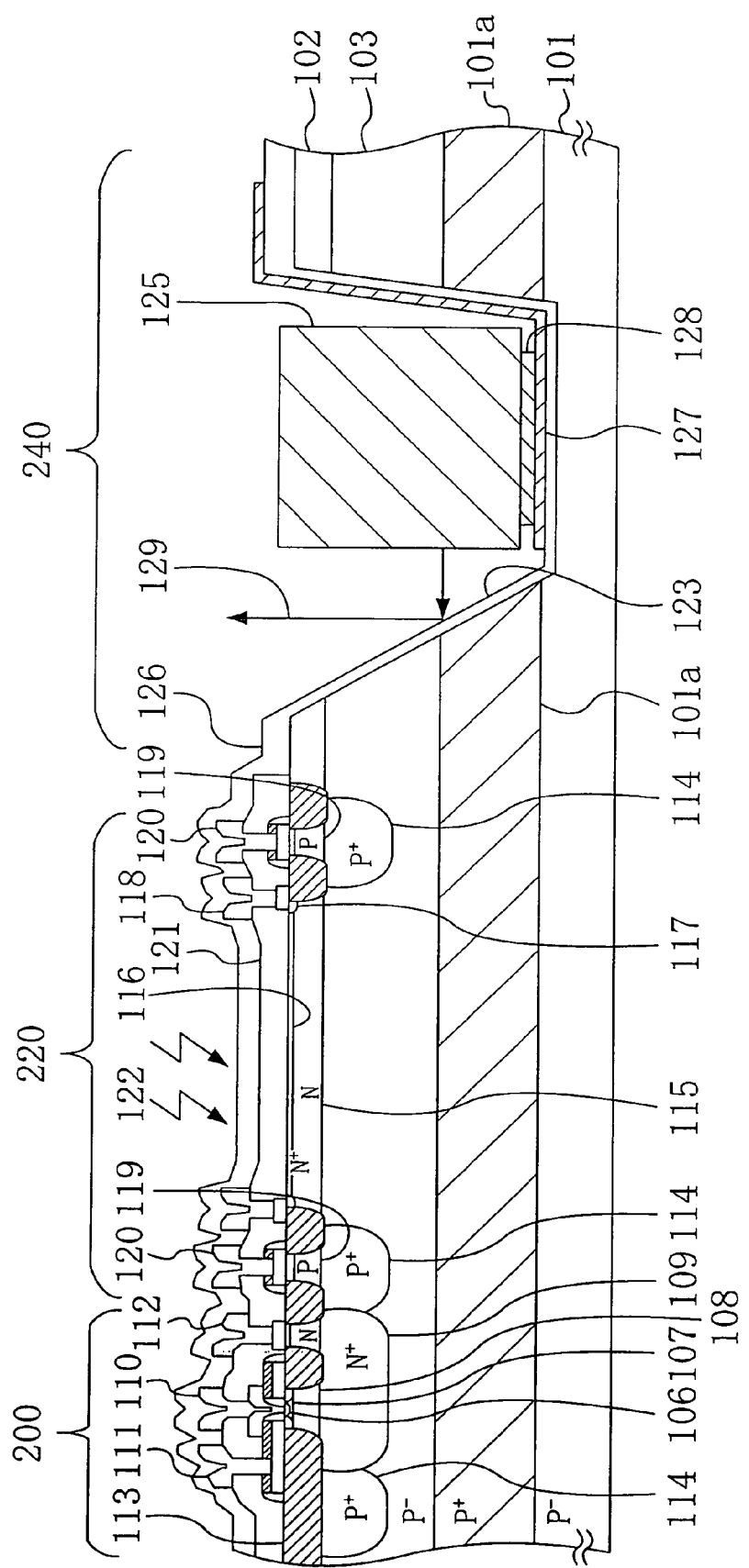
FIG. 11 shows a schematic construction in section of an optical semiconductor device according to the reference example of the present invention.

Subsequently, as shown in FIG. 9E, a micro mirror region 23 of a trench is formed in the light emitting element section 240 by etching using the isolation oxide film 13 remaining in the light emitting element section 240 as a mask. Thereafter, a semiconductor laser chip 25 is bonded on the bottom face of the trench, likewise the first fabrication method, to obtain the optical semiconductor device according to the third embodiment.

It should be noted that silicon is used for the semiconductor substrate 1 in the first to third embodiments according to the present invention, but the semiconductor substrate 1 is not limited to silicon and semiconductor substrates made of germanium or compound semiconductors which are generally used in optical devices handling a longer wavelength region may be used.

Moreover, PIN photodiode is used for the photodetector section 220 in each embodiment, but the present invention is applicable to an ordinary PN-type photodiode, an avalanche photodiode and a phototransistor, of course.

As described above, the optical semiconductor devices and the fabrication methods therefor according to the present invention exhibit an effect that a photodetector having high-speed operability and high photosensitivity and a semiconductor laser element can be formed in a single substrate, with no optical characteristic deteriorated, and is useful in optical semiconductor devices in which a photodetector and a semiconductor laser element are mounted and the fabrication methods thereof.

What is claimed is:

1. A method for fabricating an optical semiconductor device including a light emitting section, a photodetector section, and a transistor section, the method comprising the steps of:

forming a first conductivity type second semiconductor region directly on a first conductivity type first semiconductor region;

forming selectively a first buried layer having the first conductivity type of which impurity concentration is higher than that of the first semiconductor region by ion implantation to a boundary face between the first semiconductor region and the second semiconductor region in a region except the light emitting section;

after forming the first buried layer, forming selectively a second buried layer having the second conductivity type by ion plantation to the second semiconductor region, after forming the second buried layer, forming a second conductivity type third semiconductor region in an upper part of the second semiconductor region, where an impurity concentration of the second conductivity type third semiconductor region is lower than that of the second buried layer;

forming a photodetector made of the second semiconductor region and the third semiconductor region in the photodetector section;

forming selectively a transistor in a region of the second semiconductor region and the third semiconductor region in the transistor section, forming, by forming a trench by performing selective anisotropic etching on a region of the first semiconductor region and the second semiconductor region in the photodetector section, a micro mirror formed of a wall face of the trench; and bonding a semiconductor laser element, which is prepared beforehand in a form of a chip, onto a bottom face of the thus formed trench, wherein the second buried layer is formed in the upper part of the second semiconductor region.

2. The method of claim 1, wherein a depth of the second buried layer is smaller than a thickness of the second semiconductor region.

3. The method of claim 1, wherein in the ion implantation for forming the first buried layer, an implantation energy is 500 keV or more.

* * * * *